(12) United States Patent
Fournel et al.

(10) Patent No.: US 10,100,400 B2
(45) Date of Patent: Oct. 16, 2018

(54) METHOD FOR RECYCLING A SUBSTRATE HOLDER

(71) Applicant: COMMISSARIAT A L'ENERGIE ATOMIQUE ET AUX ENERGIES ALTERNATIVES, Paris (FR)

(72) Inventors: Frank Fournel, Villard-Bonnot (FR); Hubert Moriceau, Saint-Egreve (FR); Marc Zussy, Saint Egreve (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 684 days.

(21) Appl. No.: 14/136,370

(22) Filed: Dec. 20, 2013

(65) Prior Publication Data
US 2014/0178596 A1 Jun. 26, 2014

(30) Foreign Application Priority Data

Dec. 21, 2012 (FR) ...................................... 12 62737

(51) Int. Cl.
| | | |
|---|---|---|
| *C23C 14/50* | (2006.01) | |
| *C23C 16/44* | (2006.01) | |
| *H01L 21/02* | (2006.01) | |
| *H01L 21/683* | (2006.01) | |
| *C23C 14/58* | (2006.01) | |
| *C23C 14/48* | (2006.01) | |
| *C23C 16/458* | (2006.01) | |

(52) U.S. Cl.
CPC .............. *C23C 14/50* (2013.01); *C23C 14/48* (2013.01); *C23C 14/5873* (2013.01); *C23C 16/4407* (2013.01); *C23C 16/4581* (2013.01); *H01L 21/02032* (2013.01); *H01L 21/6835* (2013.01)

(58) Field of Classification Search
CPC ..... C23C 14/48; C23C 14/50; C23C 14/5873; C23C 16/4407; C23C 16/4581
See application file for complete search history.

(56) References Cited

U.S. PATENT DOCUMENTS

| | | | |
|---|---|---|---|
| 2004/0112866 A1* | 6/2004 | Maleville .......... | H01L 21/02019 216/83 |
| 2006/0057836 A1* | 3/2006 | Nagarajan ......... | H01L 21/76898 438/622 |
| 2009/0149005 A1* | 6/2009 | Tauzin .................... | C30B 25/04 438/480 |
| 2011/0259408 A1* | 10/2011 | Ramappa .............. | C23C 14/042 136/255 |
| 2013/0075365 A1* | 3/2013 | Fournel ................... | H01L 21/67 216/54 |

\* cited by examiner

*Primary Examiner* — Dah-Wei D. Yuan
*Assistant Examiner* — Kristen A Dagenais
(74) *Attorney, Agent, or Firm* — Cantor Colburn LLP

(57) ABSTRACT

A method for recycling a substrate holder adapted to receive a substrate for at least one deposition step of a layer of a material on the substrate also leading to the depositing of a layer of a material on the substrate holder, the method including implanting ion species through a receiving surface of the substrate holder so as to form at least one buried weakened plane delimiting a thin film underneath the receiving surface of the substrate holder, exfoliating the thin film from the substrate holder so as to break up the thin film, and removing a stack including at least one layer of a material deposited on the thin film resulting from the at least one deposition step of the layer of a material on the substrate.

14 Claims, 3 Drawing Sheets

METHOD FOR RECYCLING A SUBSTRATE HOLDER

CROSS REFERENCE TO RELATED APPLICATION

This application is related to and claims the benefit of French Patent Application Number 12/62737 filed on 21 Dec. 2012, the contents of which are herein incorporated by reference in their entirety.

TECHNICAL FIELD

The present invention concerns a method for recycling a substrate holder used in particular in the field of microelectronics, the substrate holder being adapted for handling a substrate for at least one depositing step to for deposition of a layer of a material on the substrate.

BACKGROUND

Substrate holders are generally used to perform technological operations in the field of microelectronics notably for substrates whose diameter is smaller than the diameter of standard substrates (i.e. than substrates whose dimensions allow the handling and conducting of technological operations in currently available standard equipment). Therefore these substrates of non-standard size can nevertheless be treated using conventional devices designed for the performing of technological operations on standard substrates. For example with a 200/300 substrate holder, it is possible to obtain the depositing of a layer of dielectric material on silicon substrates 200 mm in diameter whilst using a depositing device designed for substrates 300 mm in diameter.

Yet the substrate holders used in layer depositing devices have a limited lifetime. Over and above a threshold thickness of layers accumulated on the holder, the quantity of accumulated material is likely to cause changes in standard depositing conditions or in subsequent deposition properties. For example, for a substrate holder in silicon, when the stack of $SiO_2$ layers deposited on the holder has a thickness above a threshold thickness the stack of $SiO_2$ peels off. This leads to the formation of particles which pollute the deposition of a further $SiO_2$ layer on a substrate. The presence of a large amount of $SiO_2$ on the holder may also lead to a capacitance possibly modifying the plasma forming conditions required for the depositing of a further SiO2 layer. It is then necessary to remove the stack of layers formed on the substrate holder in order to recycle this holder and to be able to make re-use thereof for further depositing steps.

For this purpose, it is possible to perform chemical etching of the stack of layers deposited on the holder. For example, for a stack of $SiO_2$ layers, efficient use can be made of a hydrofluoric acid solution (HF). However, some deposited materials are not attacked by currently existing chemical etching solutions or they have a slow etching rate which entails very lengthy recycling treatment. In addition when the successive deposits form stacks of various materials, it is difficult to find a single chemical solution capable of removing all the deposited layers. The sequencing of several treatments in several chemical solutions is too time-consuming to be envisaged.

In addition, it is also possible to use mechanical grinding to remove the stack of layers deposited on the holder. However, some substrate holders may have a geometry making the use of grinding impossible. This is particularly the case with substrate holders whose receiving surface has a ring of peripheral material. In this case, it is difficult to carry out mechanical grinding without modifying the dimensions of the ring or the thickness of the substrate holder.

BRIEF SUMMARY

The invention proposes a method for recycling a substrate holder of which one surface called the receiving surface is adapted to receive a substrate designed for at least one deposition step of a layer of a material on the said substrate, the depositing step also leading to the depositing of a layer of a material on said holder, the method comprising the steps of:

a) Implanting ion species through the receiving surface of the substrate holder so as to form at least one buried weakened plane delimiting a thin film underneath the receiving surface of the substrate holder;

b) Exfoliating the thin film from the substrate holder so as to break up the thin film; and c) Removing a stack containing at least one layer of a material deposited on the thin film resulting from the said at least one depositing step of the layer of a material on the substrate.

By the expression 'thin film' in the present document is meant a thin film present underneath the receiving surface of the substrate holder, the thin film being continuous or discontinuous in particular in a direction substantially following the thickness of the substrate holder.

By the expression «buried weakened plane» is meant a region of narrow thickness weakened by implantation, located around the implantation depth.

Therefore, the present invention allows the facilitated removal of the material deposited on the receiving surface of the holder which was not covered by the substrate at the time of a layer depositing step. If several depositing steps are conducted, the removed material corresponds to the stack of several layers on the holder. Firstly the method of the invention overcomes constraints related to the type of deposited materials and constraints related to the geometry of the holder. Therefore, the type and number of deposited layers is of little importance since direct action is performed by implantation and exfoliation of the holder. Secondly, the method of the invention is applicable to any holder geometry. The implantation depth of ion species is constant for a holder formed of one same material. Therefore the thin film formed by implantation reproduces the profile of the receiving surface of the holder. The exfoliation of the thin film then allows the removal of the same thickness of material at every point of the receiving surface of the holder. The holder therefore maintains its initial geometry. As a result, the substrate holder is efficiently recycled and can be used for other quality depositing of layers on substrates. Evidently in the present document the implanting conditions of ion species are adapted so that the use during the at least one deposition step of the substrate holder implanted does not cause exfoliation of the thin film.

It is specified that by the expression 'exfoliate the thin film' in the present document is meant breaking up the thin film into different fragments (or pieces, portions) which are then separated from the negative—the underlying part of the substrate holder. This exfoliation step also contributes towards fragmenting the stack of layer(s) which cover the thin film at least in part, so that the removal of the stack from the surface of the negative is facilitated. After exfoliation, these fragments of thin film and of stack may remain on the surface of the negative or they may have been expelled. In this case, they may form clusters of fragments distributed in particular over the surface of the negative.

Advantageously, the substrate holder is formed of a crystalline material and preferably single-crystal such as single-crystal silicon.

Preferably, after the implantation step a), the method comprises a step for forming an additional layer on the thin film of the substrate holder and the removal step c) comprises a peel-off step of said additional layer. By the term 'peel-off' in the present document is meant the fact of removing a layer in one piece or in the form of several strips. By the expression 'formation of an additional layer' in the present document is meant the depositing of an additional layer and the cross-linking of the material of the layer if necessary.

Therefore the surface of the fragments of materials on the surface of the holder negative adheres to the additional layer which means that by peeling off each strip of additional layer it is possible to remove several fragments. The removal of fragments and the cleaning of the negative surface are thereby facilitated.

According to one provision the additional layer is formed in a polymer material, in particular in a glassy polymer such as BCB (BenzoCycloButene), and for example DVS-bis-BCB (DiVinylSyloxane-bis-benzoCycloButene). The type of the additional layer is chosen so as to allow a possible rise in temperature for the exfoliation treatment at step b) of the method. BCB is a material of choice since it can be cross-linked at temperatures of up to 320° C. and left for several hours at temperatures of 400° C. without any notable degradation. In this case, it is possible to implant small doses of ion species so as to increase exfoliation heat budgets and allow the depositing of BCB in particular at high temperatures, for example 300° C. without causing exfoliation whilst reducing the cost and time of the implantation step. The BCB polymer is also advantageous in that it has a higher coefficient of thermal expansion (CTE) than a silicon substrate holder at ambient temperature, respectively in the order of 40 ppm and in the order of 2.5 ppm. During the different heat treatments applied to the structure, this difference in CTE generates stresses which promote peel-off and removal.

For example, after depositing the additional layer in BCB and after heat treatment for polymerization of the resin e.g. 300° C., the stresses related to the differences in CTE between the different materials on returning to ambient temperature allow the facilitated removal of the stack and of the polymer in the form of strips. If the additional BCB layer has a thickness of more than 100 micrometers for example, the removal of the stack and of the layer occurs abruptly during the decrease in temperature.

Typically, the additional layer had a thickness of more than 10 μm. This thickness of the additional layer effectively promotes the removal of the stack after exfoliation.

According to one possibility, the thickness of the additional layer may optionally be obtained by two-step depositing. In this case, a first part of the layer is deposited before implantation step a) and another part of the layer is deposited after implantation step a). The thickness of the first part of additional layer deposited before the implantation step advantageously has a thickness of less than one micron so as to allow the implanted species to enter sufficiently deeply into the substrate holder, underneath the deposited layers.

It is to be understood in the present document that the formation of an additional layer on the thin film means that the layer can be deposited directly on and in contact with the thin film, or when applicable on the stack of at least one layer covering the thin film at least in part.

According to one provision, the step for forming the additional layer is performed after the exfoliation step b). In this manner, the already formed fragments together provide an available surface for adhesion to the additional layer of larger size.

In this configuration, the peel-off step of the additional layer may advantageously be conducted immediately after the step for forming the additional layer. The removal of the different portions of thin film and stack is thereby facilitated.

According to one alternative, the step for forming the additional layer is performed before the exfoliation step b). The presence of the additional layer allows the preventing of particle contamination (by the formed fragments) of the environment in which exfoliation takes place e.g. an oven, In some cases, the dispersion of some materials in powder form must even be prevented for safety reasons, for example with III-V or II-V materials such as AsGa or InP.

According to one possible embodiment the removal step c) comprises a step for cleaning the surface of the negative of the substrate holder with a pressurized jet of water. By the term 'substrate holder negative' in the present document is meant the residue of the substrate holder underlying the thin film, delimited by the buried weakened region on the side opposite the thin film and which is separated from the thin film after exfoliation. This cleaning therefore allows efficient removal of the fragments of the stack and of the thin film to finalize recycling of the substrate holder negative. It is possible, after this step, to re-condition the surface of the substrate holder negative to make it compatible with further use. For this purpose, it is possible to carry out chemical treatments to make the receiving surface hydrophobic for example, to conduct heat annealing for smoothing or on the contrary to degrade roughness in order to degrade adherence. It is also possible to carry out thermal oxidation or to deposition other specific materials to make the holder compatible with re-use.

The cleaning step with pressurized water jet can be performed after the peel-off step of an additional layer. In this case, the water jet can complete the cleaning of the substrate holder negative for future use.

According to one possibility, the exfoliation step b) of the thin film comprises a step for applying exfoliation heat treatment. Heat treatment allows an increase in the number and size of the cavities formed after implanting ion species, the cavities defining the buried weakened plane. Exfoliation heat treatment then consists of applying a heat budget whose temperature and length are adapted to obtain exfoliation at the buried weakened plane. This heat budget is applied at set or variable temperature for determined lengths of time. This exfoliation heat treatment step can be assisted by mechanical force.

According to one variant, all or part of the exfoliation heat treatment is performed before the formation of an additional layer. This makes it possible to avoid damaging the material of the additional layer which may be sensitive to the temperature applied during this treatment. In this case, often related to the use of a polymer, the heat treatment can be carried out before the depositing of the additional layer in polymer and exfoliation can be obtained by applying an additional mechanical force and/or applying an additional heat budget at a temperature compatible with the polymer.

According to one provision the implantation step a) leads to the formation of cavities defining the thin film, and after the implantation step a) and before the exfoliation step b) the method comprises a heat pre-treatment step adapted to increase the number and size of the cavities. With this step it is possible to prepare the exfoliation step through application of the heat pre-treatment whose heat budget corresponds to a fraction of the heat budget leading to exfoliation. Evidently, this heat pre-treatment is adapted so that the heat budget and/or mechanical stresses brought by the at least one deposition step of a layer of material on a substrate does not cause the exfoliation step.

Preferably, the exfoliation step b) of the thin film comprises a step entailing the deposition of a surface layer on the thin film and on the stack of at least the layer of a material deposited on the thin film. Depending on the type and thickness of the material of the deposited surface layer, this latter layer increases the stiffness of the assembly of layers located on the side of the thin film relative to the weakened plane, so that the exfoliation step leads to fragmenting into larger pieces. Evidently the surface layer in this document does not allow the contributing of a stiffening effect that would be required for obtaining detachment of continuous thin film.

Advantageously, the material of the surface layer has a coefficient of thermal expansion CTE that differs from the CTE of the material of the substrate holder. Therefore the contraction or expansion of the material of the substrate holder differs from that of the material of the surface layer during changes of temperature. Since the substrate holder is of greater thickness than the surface layer, the holder imposes contraction or expansion upon the surface layer thereby generating stresses within the latter. These stresses cause enhancing of the peel-off forces present on the periphery of the deposited stack, which promotes exfoliation. On this account, it is then possible to reduce the dose of implanted ion species so as to reduce implanting time, to reduce the cost of holder recycling or to reduce the heat budget before exfoliation. With lower doses the heat budget to obtain exfoliation is generally increased.

Preferably, the surface layer has intrinsic stress. This stress related to the depositing mode of the layer can then be used to take part in the separating forces of the stack by peel-off from the substrate holder.

According to one possibility, the method comprises a step for forming an additional layer and a surface layer on the thin film so as to reinforce the stiffener effect and increase the effect of the stresses provided by the differences in coefficient of thermal expansion of the materials.

According to one provision, the receiving surface of the substrate holder comprises a planar main region to receive a substrate and a peripheral region comprising excess thickness of material adapted to hold the substrate in place for the depositing of a layer of material, and the implantation step a) comprises the implanting of ion species through the peripheral region of the receiving surface so that the buried weakened plane delimits a thin film underneath the peripheral region.

Therefore the weakened plane and the thin film formed by this step a) are solely located underneath the peripheral region of the receiving surface. This is advantageous in that the layer of a material is not deposited on the main planar region of the surface receiving the substrate. It is then unnecessary to exfoliate a thin film at this main planar region. By means of this provision the state of the main planar region of the holder is not modified by implantation, making it possible to minimize the extent of the receiving surface to be treated.

It is to be understood in the present document that the main planar region and the peripheral region may or may not be formed of one same material.

The peripheral region comprising excess thickness of material may be formed by spaced-apart pads of material or a continuous or discontinuous ring of material surrounding the main planar region so as to encircle the substrate and provide good support during handling thereof outside and inside the layer depositing device.

According to one variant, the implantation step a) is performed underneath the main planar region and underneath the peripheral region, leading to the formation of a first buried weakened plane underneath the main planar region and the formation of a second buried weakened plane underneath the peripheral region, the accumulation of the first buried weakened plane and the second buried weakened plane delimiting the thin film.

If a single material is used for the main planar region and the peripheral region, the implanting depth of the ion species is constant underneath the receiving surface of the holder, the buried weakened plane that is obtained then has identical topology to the receiving surface of the holder. Exfoliation therefore occurs over the entirety of the receiving surface of the substrate holder reproducing the topology of the receiving surface.

According to one provision the recycling method before step b) comprises the steps of i) depositing the substrate on the receiving surface of the substrate holder, ii) depositing the layer of a material on the substrate and on said substrate holder, iii) removing the substrate from the receiving surface, and step c) comprises the removal of the stack containing at least the layer of a material deposited on the substrate holder.

Preferably, the recycling method comprises the repeat at least once of steps i) to iii) before performing the exfoliation step b).

Advantageously, before the exfoliation step b), the method comprises several successive deposition steps of a layer of at least one material so as to form a stack of several successive layers of at least one material on the thin film. In this manner, recycling is carried out after several uses of the substrate holder to optimize yields and recycling costs.

According to one provision the implantation step a) is performed after at least one deposition step of a layer of a material on the substrate. The thickness of material located above the buried weakened plane is then increased which promotes the formation of larger size fragments during the exfoliation step b). This makes it possible to limit the implanting energy of the ion species to form the buried weakened plane within the substrate holder.

According to one alternative, the implantation step a) is conducted before a deposition step of a layer of a material on the substrate.

According to one possibility, the exfoliation step b) is conducted when the thickness of the stack of at least one layer of a material deposited on the thin film is preferably less than 50 micrometers, even less than 20 micrometers, and is for example between 1 and 7 micrometers. The use of the substrate holder is thereby optimized so that recycling is only performed when the stack of at least one material deposited on the holder exceeds a threshold thickness deteriorating the quality of layer deposit.

According to one possible example of embodiment, the substrate holder comprises a silicon wafer 300 mm in diameter comprising a ring having a thickness of more than 725 micrometers and a width of between 5 mm and 5 cm, the substrate holder being adapted for at least one handling operation of a silicon substrate having a diameter of 200 mm and for the depositing of at least one layer of a material in titanium dioxide having a thickness of about 1.5 µm, step a)

comprising the implanting of hydrogen at an energy of between 1 and 300 keV, preferably 250 keV, and at a dose of between $1 \cdot 10^{15}$ and $1 \cdot 10^{17}$ at/cm$^2$, the exfoliation step b) comprising the application of heat treatment at a temperature of between 200° C. and 500° C. for a time of between a few minutes and a few hours, and the removal step c) of the stack comprising a step for forming and then a step for peeling off an additional layer of BCB deposited on the thin film.

BRIEF DESCRIPTION OF THE DRAWINGS

Other aspects, objectives and advantages of the present invention will become better apparent on reading the following description of one embodiment thereof, given as a non-limiting example and with reference to the appended drawings. Not all the elements in the figures are necessarily drawn to scale for better legibility. The dotted lines symbolize a buried weakened plane. In the remainder of the description and for reasons of simplification, identical, similar or equivalent elements in the different embodiments carry the same reference numbers.

DETAILED DESCRIPTION

Figure 1:
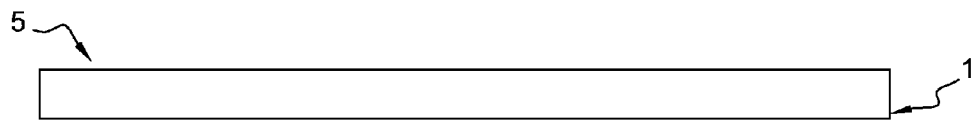
FIGS. 1 to 6 illustrate one embodiment of the method of the invention.

FIG. 1 illustrates a substrate holder 1 formed of a silicon wafer having a planar receiving surface 5 with a diameter of 300 mm and resistivity of about 10 ohm·cm. This wafer is particularly adapted for receiving, holding and handling a substrate 2 e.g. a silicon wafer 200 mm in diameter on which a layer of a material 3 is to be deposited.

Figure 2:
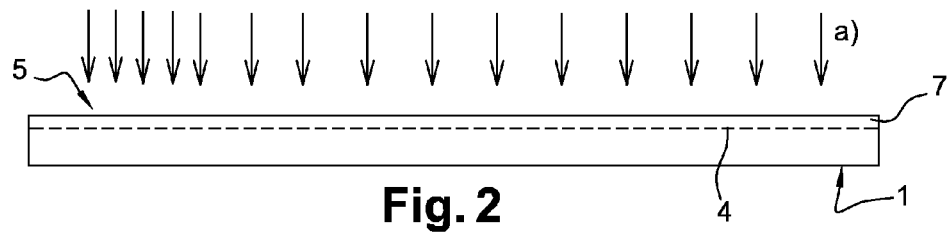

FIG. 2 illustrates a step a) of the method consisting of implanting ion species in the holder 1, such as hydrogen ions at an energy of between 1 and 300 keV, e.g. 180 keV, and at a dose of between $1 \cdot 10^{16}$ and $1 \cdot 10^{17}$ at/cm$^2$, e.g. $5 \cdot 10^{16}$ at/cm$^2$. This implantation at this energy leads to forming a buried weakened plane 4 within the holder 1 substantially parallel to the receiving surface 5 and delimiting a thin film 7.

Figure 3:
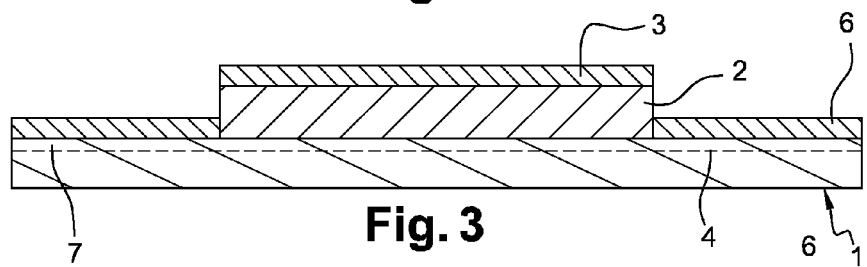

FIG. 3 illustrates a depositing step at 200° C. to deposit a layer of titanium dioxide TiO$_2$ on the surface of a substrate 2 held in place on the substrate holder 1. Since the substrate holder 1 has a larger diameter than the substrate 2, the layer 3 of titanium dioxide is also deposited on the holder 1, which initiates the formation of a stack 6 on the holder 1.

Figure 4:
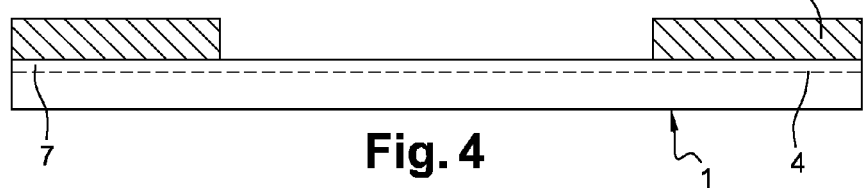
Figure 5:
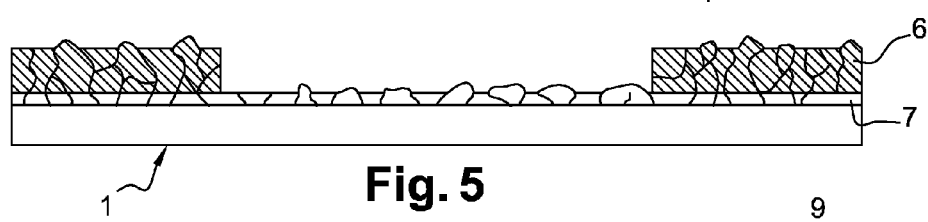

FIG. 4 illustrates the substrate holder 1 previously used to perform several successive deposits of a layer 3 of TiO$_2$ on a substrate 2 (the last substrate on which a layer 3 was deposited having been removed from the holder). The stack 6 of layers of material deposited on the holder 1 therefore results from successive deposits of layers 3 each made on a silicon substrate 2. When the thickness of the stack 6 reaches a threshold value, here about 5 micrometers, an exfoliation step b) of the thin film 7 is carried out as illustrated in FIG. 5. The threshold value of the thickness of the stack 6 beyond which exfoliation is conducted is dependent upon the type of deposited material, on the global heat budget used to form the stack and is determined as from the time at which the depositing of a new layer 3 is perturbed by a variation in the deposition method (variation in capacitive radiofrequency plasmas . . . ) or by detachment of particles from the stack 6.

As illustrated in FIG. 5, the exfoliation step b) leads to breaking-up of the thin film 7 and of the stack 6, the fragments derived from exfoliation remaining on the surface of the negative 8 of the holder 1 or being clustered in different heaps on its surface. The exfoliation step b) can be obtained by applying an exfoliation heat treatment to the substrate holder 1 such as illustrated in FIG. 4. This exfoliation heat treatment conducted at about 500° C. for 2 hours provides the heat budget allowing growth in the number and/or size of the cavities formed by implantation. This causes fracture of the material at the buried weakened plane 4 and exfoliation of the thin film 7 and of the stack 6 by which it is at least partly covered (FIG. 5).

It is to be understood in the present document that the implantation conditions, the heat budget applied and the thickness of the materials above the buried weakened plane 4 are not adapted to detachment of a whole continuous thin film 7 of material, but to obtaining fragmenting of the thin film 7 into several fragments.

Figure 6:
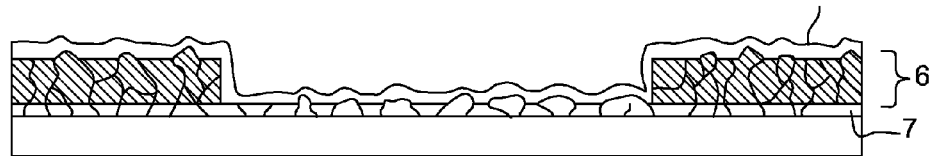

FIG. 6 illustrates a removal step c) to remove the stack 6 which was broken up with the thin film 7.

For this purpose, an additional polymer layer 9 is deposited, for example using a spin coating technique, or by spraying onto the surface of the fragments (still attached to the substrate holder 1), followed by peel-off for example using an adapted grasping and lifting tool to peel off the additional layer 9. The fragments adhere to the additional layer 9 and are therefore easily removed during peel-off. If the additional polymer layer 9 is a BCB film (for example XU35075 by Dow), it is spread by spin coating at between 500 and 1000 rpm at a thickness of the order of 40 micrometers. The resin obtained is polymerized at 250° C. for at least 1 h.

Figure 7:
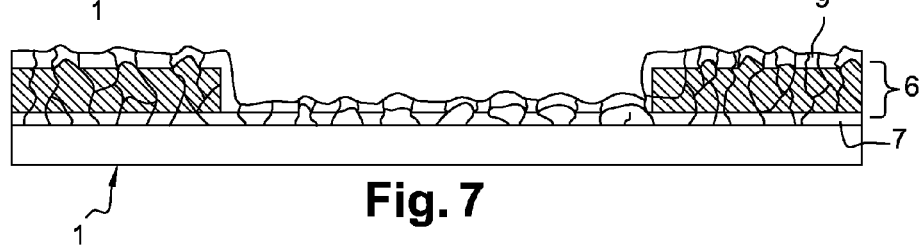
FIG. 7 illustrates a variant of embodiment.

According to one variant illustrated in FIG. 7, the step for forming the additional layer 9 takes place before the exfoliation step b) and the step for removing fragments from the stack and from the polymer is performed by peel-off after exfoliation. In this case, if the polymer is of BCB type, the exfoliation temperature is lowered to 400° C. so as not to damage the polymer and the heating time is extended to 5 h.

The negative 8 of the substrate holder 1 is then freed of exfoliation fragments; its surface has topology close to that of the receiving surface 5 of the initial holder 1. The negative 8 is able again to be used for depositing steps of a layer 3 on a substrate 2. Similarly, it can be recycled after a certain number of deposition steps of a layer 3, under the same conditions as those previously described.

According to one possibility, the surface of the negative 8 of the substrate holder 1 is then cleaned by a pressurized water jet.

According to one non-illustrated alternative, the removal step c) to remove the stack 6 is only obtained by using a pressurized water jet applied to the holder 1 as illustrated in FIG. 5, without previously performing any deposition and peel-off of an additional layer 9.

Figure 8:
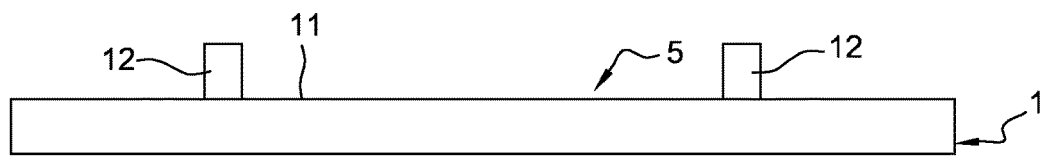
FIGS. 8 to 13 illustrate a variant of the embodiment of the method illustrated in FIGS. 1 to 6.

FIG. 8 illustrates a substrate holder 1 in silicon having a diameter of 300 mm for example whose receiving surface 5 comprises a main planar region 11 and an added peripheral region 12 in the form of a ring of material allowing the receiving and holding in position of a substrate 2 in silicon or germanium having a diameter of 200 mm and thickness of 450 micrometers. In this example, the ring 12 has a thickness of about 720 micrometers and width of between 5 mm and 5 cm.

Figure 9:
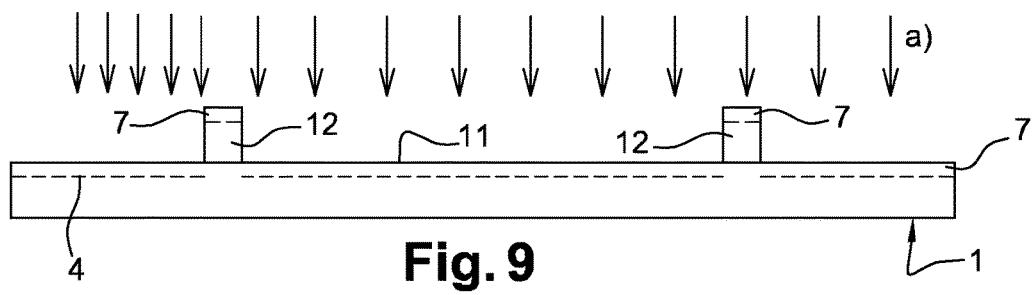

FIG. 9 illustrates the step for implanting hydrogen ions at an energy of about 190 keV and at a dose of about $7 \cdot 10^{16}$ at/cm² so as to form a first buried weakened plane underneath the main planar region 11 and a second ring-shaped buried weakened plane underneath the ring region 12. As illustrated in FIG. 9, these two weakened planes form a discontinuous thin film 7 which nevertheless extends under the entirety of the receiving surface 5 of the holder 1. If the ring region 12 and the main region 11 are in one same material, e.g. silicon, the depths at which the two weakened planes are formed are identical.

According to one non-illustrated possibility, implantation is conducted solely through the peripheral region 12 comprising the ring so as only to exfoliate a portion of the receiving surface 5 of the substrate holder 1.

Figure 10:
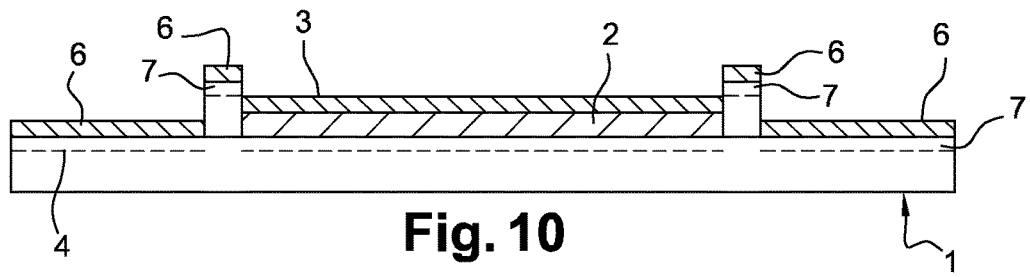

FIG. 10 illustrates a deposition step of a layer 3 of $SiO_2$ (e.g. by PECVD), nickel (e.g. by PVD) or $TiO_2$ on the substrate 2. Since the substrate holder 1 has a larger diameter than the substrate 2, this deposition also leads to the formation of a layer 3 of material on the holder 1.

Figure 11:
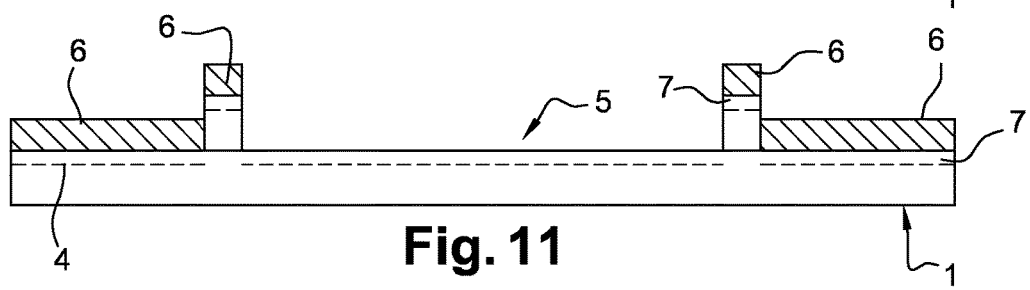

FIG. 11 illustrates the stack 6 formed by the succession of layers deposited on the holder 1, resulting from use of the holder 1 for the successive holding of several substrates 2 on which a layer 3 has been deposited.

Figure 12:
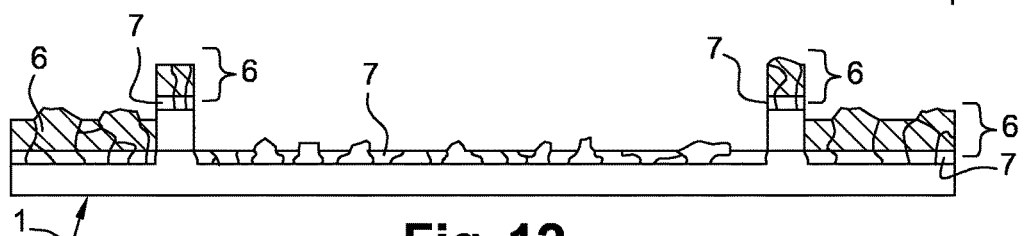

As illustrated in FIG. 12, once the threshold value of the stack 6 has been exceeded beyond which further depositing of a layer 3 is no longer optimal, e.g. 5 micrometers, heat treatment is applied for about 2 hours at 500° C. so as to cause exfoliation of the thin film 7.

Figure 13:
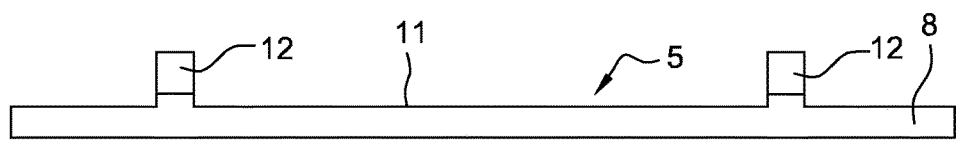

As illustrated in FIG. 13, according to one possible embodiment a removal step performed by peeling off an additional layer 9 formed before the exfoliation step (not illustrated in the Figures) allows the cleaning of the entire surface of the negative 8 of the holder 1. If the additional polymer layer is in BCB for example, the exfoliation temperature is lowered to 400° C. for example.

The negative 8 has a main planar region 11 and a ring-shaped peripheral region 12 formed of material similar to regions 11, 12 respectively of the substrate holder 1 before use. As a result, the negative 8 can again be used as substrate holder 1 for further deposits of layers 3 in the same manner as previously described. According to one possibility, not described, once the threshold thickness of the stack 6 of layers has been reached on the negative 8, this negative can again be recycled by repeating the invention.

Figure 14:
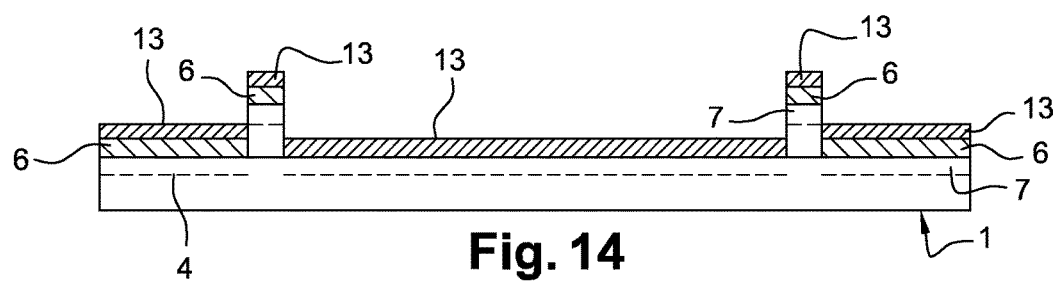
FIG. 14 illustrates another variant of embodiment of the method of the invention.

According to one variant of embodiment illustrated in FIG. 14, a surface layer 13 e.g. in Si is deposited at a thickness of 5 micrometers on the thin film 7 and on the stack 6 formed by the successively deposited layers before carrying out the exfoliation step b). This surface layer 13 via its thickness contributes towards increasing the thickness of the assembly of materials lying above the buried weakened plane 4 so that exfoliation leads to the formation of fragments of larger size. This subsequently facilitates the removal step c) and finalization of recycling of the negative 8 of the substrate holder 1.

According to another variant of embodiment, a surface layer 13 of silicon dioxide is deposited at 200° C. by PECVD (Plasma Enhanced Chemical Vapor Deposition) at a thickness of 10 micrometers on a stack 6 of layers of $TiO_2$ having a thickness of 1 micrometer derived from the successive deposits of a layer 3 on the substrate 2. The $SiO_2$ material does not have the same CTE as Si material which means that when applying the exfoliation heat treatment at 500° C. at step b) of the method, the layer 13 of $SiO_2$ is subjected to tensile stress contributing towards exfoliation. Since exfoliation is promoted, the length of exfoliation heat treatment can be reduced compared with the treatment applied if there is no stressed layer 13, whilst allowing the exfoliation of large-size fragments. The use of a stressed layer 13 may additionally allow an upstream reduction in the dose of hydrogen ions implanted into the silicon holder 1. The dose can effectively be reduced from $5 \cdot 10^{16}$ at/cm² to $4 \cdot 10^{16}$ at/cm² so that the cycle time is shorter and the recycling method less costly.

According to yet another variant of embodiment a surface layer 13 of amorphous silicon is deposited by PECVD at a temperature of 250° C. and over a thickness of 15 micrometers. Since implantation was previously performed at a dose of $4 \cdot 10^{16}$ at/cm², exfoliation heat treatment at 500° C. for 1 hour allows exfoliation of the stack 6.

Figure 15:
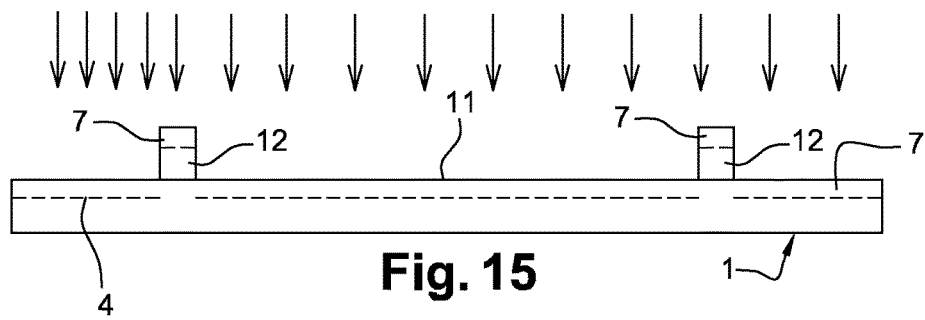
FIGS. 15 to 19 illustrate a further variant of embodiment of the method of the invention.

FIGS. 15 to 19 illustrate another variant of embodiment of the method. As illustrated in FIG. 15, an implantation step a) to implant helium ions is performed with energy of 190 keV and dose of $6 \cdot 10^{16}$ at/cm² underneath the receiving surface 5 of a substrate holder 1 in silicon.

Figure 16:
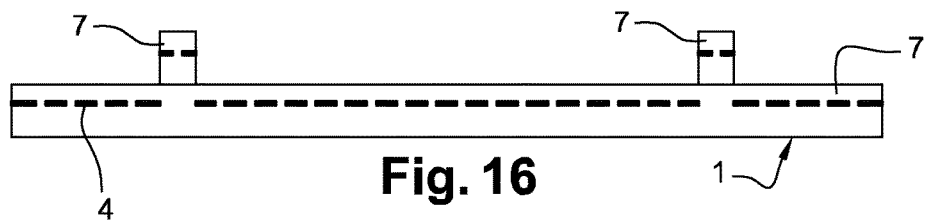

Then, with reference to FIG. 16, heat pre-treatment is conducted at 900° C. for 2 hours so as to increase the number and size of helium cavities at the buried weakened plane 4 without however causing exfoliation of the thin film 7 of silicon. It is to be understood in the present document that the heat pre-treatment is also adapted so that the heat budget of the subsequent deposition steps of layers 3 does not cause exfoliation.

Figure 17:
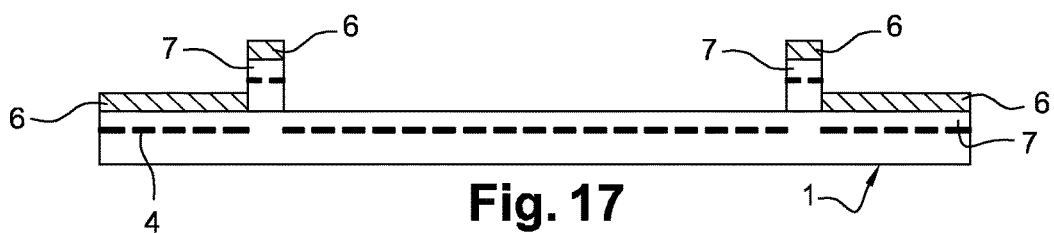

FIG. 17 illustrates the substrate holder 1 after use and successive deposits of a layer 3 of $TiO_2$ on a substrate 2, until a threshold thickness of the stack 6 is obtained of about 5 micrometers on the holder 1. It is to be noted that the stack 6 of $TiO_2$ is placed under compression during the exfoliation heat treatment but the stress generated is not sufficient alone to obtain exfoliation thereof.

Figure 18:
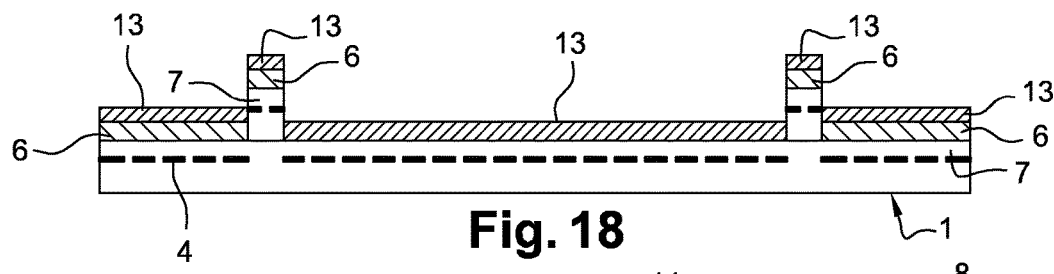

FIG. 18 illustrates a deposition step of a surface layer 13 of silicon nitride by PECVD at 400° C. until a thickness of about 10 micrometers is obtained. After return to ambient temperature, the difference in contraction of the silicon of the holder 1 and of the silicon nitride of the surface layer 13, together with the intrinsic stresses of depositing, generates stress within the holder 1. Since a heat pre-treatment was applied, this stress is alone sufficient to cause exfoliation of the thin film 7.

Figure 19:
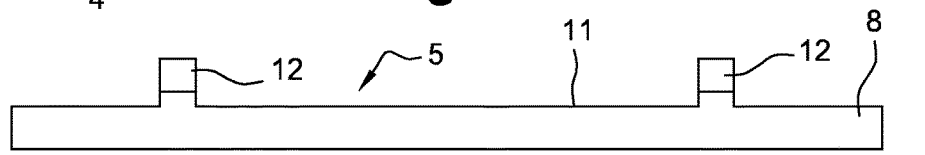

As illustrated in FIG. 19, the negative 8 of the substrate holder 1 recovered after removing the fragments and cleaning has a main planar region 11 and a peripheral region 12 in the form of a ring of material, identical to those of the substrate holder 1 before use.

The present invention therefore proposes a method for recycling a substrate holder 1 that is simple to implement and which can be used irrespective of the type of material and geometry of the holder 1.

Evidently, the invention is not limited to the variants of embodiment described above as examples, but encompasses all technical equivalents and variants of the described means and the combinations thereof.

The invention claimed is:

1. A method for recycling a substrate holder of which one surface, called the receiving surface, is adapted for receiving and handling a substrate designed for at least one deposition step of a layer of a material on said substrate, the deposition step also leading to the deposition of a layer of a material on regions of said substrate holder that are not covered by the substrate during the deposition step, the method comprising the steps of:

a) Implanting ion species through the receiving surface of the substrate holder so as to form at least one buried weakened plane delimiting a thin film underneath the receiving surface of the substrate holder;

b) Placing the substrate on the receiving surface of the substrate holder, c) Depositing the layer of a material on the substrate and on said substrate holder, and d) Removing the substrate from the receiving surface, e) Exfoliating the thin film from the substrate holder so as to break up the thin film; and f) Removing at least a stack comprising the layer of a material deposited on regions of said substrate holder that are not covered by the substrate during the deposition step.

2. The recycling method according to claim 1, wherein after the implantation step a) the method comprises a step for forming an additional layer on the thin film of the substrate holder and in that the removal step f) comprises a step for peeling off the additional layer.

3. The recycling method according to claim 2, wherein the additional layer is in a polymer material, in particular in a glassy polymer such as BenzoCycloButene (BCB).

4. The recycling method according to claim 1, wherein the removal step c) comprises a step for cleaning the surface of the negative of the substrate holder using a pressurized water jet.

5. The recycling method according to claim 1, wherein the exfoliation e) of the thin film comprises a step for applying an exfoliation heat treatment.

6. The recycling method according to claim 1, wherein the implantation step a) leads to the formation of cavities defining the thin film and in that after the implantation step a) and before the exfoliation step e) the method comprises a heat pre-treatment step adapted to increase the number and size of the cavities.

7. The recycling method according to claim 1, wherein the exfoliation step e) of the thin film comprises a step comprising the deposition of a surface layer on the thin film and on the stack of at least the layer of a material deposited on the thin film.

8. The recycling method according to claim 1, wherein the receiving surface of the substrate holder comprises a main planar region allowing the receiving of a substrate and a peripheral region having an excess thickness of material adapted to hold the substrate in position for the depositing of a layer of a material, and in that the implantation step a) comprises the implanting of ion species through the peripheral region of the receiving surface so that the buried weakened plane delimits the thin film underneath the peripheral region.

9. The recycling method according to claim 1, wherein before the exfoliation step e), the method comprises several successive deposition steps of a layer of at least one material so as to form a stack of several successive layers of at least one material on the thin film.

10. The recycling method according to claim 1, wherein the exfoliation step e) is performed when the thickness of the stack of at least the layer of a material deposited on the thin film is less than 50 micrometers.

11. The recycling method according to claim 1, wherein the substrate holder comprises a silicon wafer 300 mm in diameter and having a peripheral region in the form of a ring of thickness greater than 725 micrometers and of width between 5 mm and 5 cm, the substrate holder being adapted for at least one handling of a silicon substrate having a diameter of 200 mm and for at least the depositing of a layer of a material in titanium dioxide having a thickness of about 1.5 micrometers, step a) comprising the implanting of hydrogen at an energy of between 1 and 300 keV and at a dose of between $1.10^{15}$ and $1.10^{17}$ at/cm², the exfoliation step e) comprising the application of heat treatment at a temperature of between 200° C. and 500° C. for a time of between a few minutes to a few hours, and the removal step f) of the stack comprising a step for forming and then a step for peeling off an additional layer in BCB deposited on the thin film.

12. The recycling method according to claim 1, wherein the step of exfoliating the thin film further includes a step comprising the deposition of a surface layer on the thin film and on the sack of at least the layer of a material deposited on the thin film, the material of the surface layer having a different CTE from the CTE of the material of the substrate holder.

13. The recycling method according to claim 1, wherein the receiving surface further includes a main planar region allowing the receiving of a substrate and a peripheral region having an excess thickness of material adapted to hold the substrate in position for the depositing of a layer of a material, and the implanting step a) includes the implanting of ion species through the main planar region and through the peripheral region of the receiving surface leading to the formation of a first buried weakened plane underneath the peripheral region, the accumulation of the first buried weakened plane and of the second buried weakened plane delimiting the thin film.

14. The recycling method according to claim 1, wherein the recycling method comprises the repeat at least once of steps b) to d) before performing the exfoliation step e).

* * * * *